United States Patent [19]

Matsukawa

[11] Patent Number: 4,847,673
[45] Date of Patent: Jul. 11, 1989

[54] SEMICONDUCTOR DEVICE

[75] Inventor: Takayuki Matsukawa, Hyogo, Japan

[73] Assignee: Mitsubishi Denki K.K., Tokyo, Japan

[21] Appl. No.: 40,166

[22] Filed: Apr. 20, 1987

[30] Foreign Application Priority Data

Jul. 29, 1986 [JP] Japan .................................. 61-179519

[51] Int. Cl.$^4$ ..................... H01L 29/06; H01L 23/48; H01L 29/46
[52] U.S. Cl. ......................................... 357/55; 357/71; 357/68
[58] Field of Search ............................. 357/55, 71, 68

[56] References Cited

U.S. PATENT DOCUMENTS

| | | | |
|---|---|---|---|
| 3,947,957 | 4/1976 | Luttmer | 357/71 |
| 4,471,524 | 9/1984 | Kinsbron et al. | 357/71 |
| 4,566,940 | 1/1986 | Itsumi et al. | 357/71 |
| 4,605,470 | 8/1986 | Gwozdz et al. | 357/71 R |
| 4,613,888 | 9/1986 | Mase et al. | 357/71 |
| 4,630,088 | 12/1986 | Ogura et al. | 357/55 |
| 4,646,126 | 2/1987 | Iizuka | 357/71 R |
| 4,682,204 | 7/1987 | Shiozaki et al. | 357/55 |
| 4,734,754 | 3/1988 | Nikawa | 357/71 |

FOREIGN PATENT DOCUMENTS 60-088443  5/1985  Japan .

OTHER PUBLICATIONS

Mogab, C., "Dry Etching", *VLSI Technology*, p. 305, (1983).

Primary Examiner—Rolf Hille
Assistant Examiner—Robert P. Limanek
Attorney, Agent, or Firm—Takeuchi Patent Office

[57] ABSTRACT

Grooves having a predetermined depth are formed on an insulating layer, and an electrode wiring layer is provided in the grooves of the insulating layer. The electrode wiring layer is formed to fill the grooves either completely or partially to a predetermined thickness on the inner wall surfaces of the grooves.

2 Claims, 4 Drawing Sheets

SEMICONDUCTOR DEVICE

BACKGROUND OF THE INVENTION

1. Field of the Invention

This invention relates to a semiconductor device and, more particularly, to a semiconductor device having a fine wiring pattern with a gap of $2\mu$ or below.

DESCRIPTION OF THE PRIOR ART

FIGS. 3(a) to 3(d) are sectional views showing the fabrication of a prior art semiconductor device "Electronic Integrated Circuits", J. Allison, McGraw-Hill (1975), (English translation: McGraw-Hill Koyusha), Chapter 1. Referring to the Figures, reference numeral 1 designates a semiconductor substrate, numeral 2 an insulating layer, numeral 3 an electrode wiring layer made of an aluminum alloy, for instance, and numeral 4 a resist.

In this prior art semiconductor device, the electrode wiring layer 3 is formed in the following way. As shown in FIG. 3(a), the semiconductor substrate 1 made of silicon is subjected to various processes such as the formation of a diffused layer and a gate pattern necessary for the construction of an integrated circuit, and then the ground insulating layer 2 for an electrode wiring is formed. Then, a wiring material layer 3A in the form of the thin film is formed. The most frequently used wiring material is an aluminum alloy containing several percent of silicon or the like.

Then, the resist 4 is coated over the entire surface, and then exposed and developed by the ordinary photographic plate manufacturing technique, thus forming the resist pattern 4 corresponding to a wiring pattern (FIG. 3b). Then, the wiring material layer 3A is etched with the resist 4 used as a mask (FIG. 3c). Then, the resist 4 is removed by means of oxygen plasma, whereby forming a pattern of the electrode wiring layer 3 (FIG. 3d). Finally, the entire system is annealed at a temperature above 400° C. to obtain a reliable ohmic (non-rectifying) contact with the silicon layer.

In the above prior art semiconductor device, however, the aluminum alloy is subject to rearrangement of the metal crystals when it is thermally treated at a temperature above 300° C. During this process, hillrocks (projections) are produced toward the free interface in order to alleviate the internal stress. Therefore, when the wiring gap becomes less than $2\mu$, a short-curcuit with a hillrock between the adjacent wiring electrodes occurs as shown in a circle of A of FIG. 4.

SUMMARY OF THE INVENTION

The primary object of the invention is to provide a semiconductor device, in which no short-circuit occurs between adjacent wiring lines even if the gap is reduced to be less than $2\mu$, so that it is possible to realize a very high integration degree.

Another object of the invention is to facilitate the formation of a fine wiring pattern by forming the final electrode pattern on the group insulating layer having a low light reflectivity.

The above and other objects, features and advantages of the invention will become more apparent from the following description with reference to the accompanying drawings.

BRIEF DESCRIPTION OF THE DRAWINGS

FIG. 4 is a plan view for explaining a drawback in the prior art semiconductor.

DESCRIPTION OF THE PREFERRED EMBODIMENT

Figure 1A:
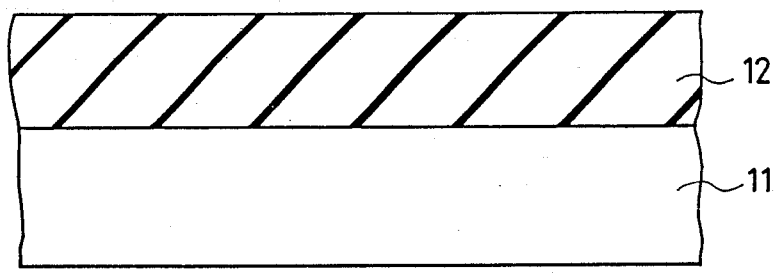
FIGS. 1(a) to 1(f) are sectional views showing steps of making a semiconductor device according to one embodiment of the invention.
Figure 1B:
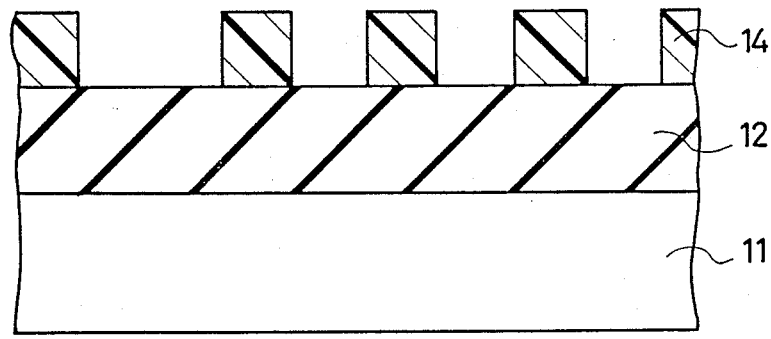
Figure 1C:
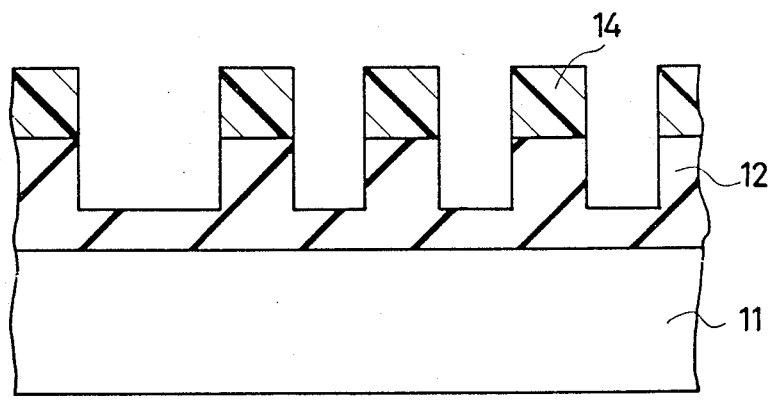
Figure 1D:
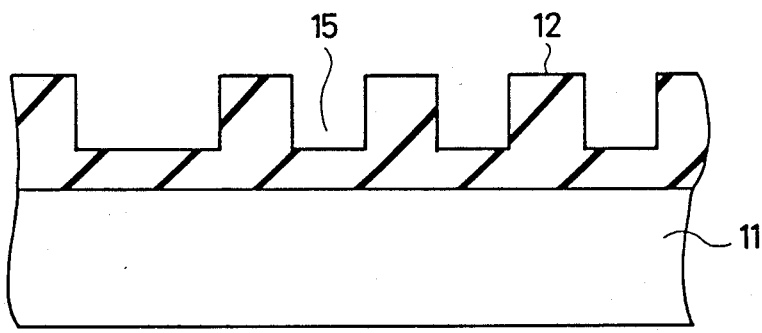
Figure 1E:
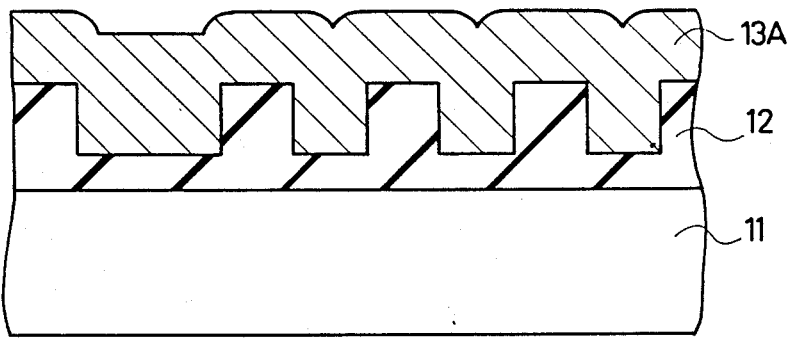

In FIGS. 1(a) to 1(f), reference numeral 11 designates a semiconductor substrate, numeral 12 an insulating layer made of silicon oxide or silicon nitride, for instance, numeral 13 an electrode wiring layer made of an aluminum alloy, numeral 14 a resist, and numeral 15 grooves formed by etching in the surface of the insulating layer 12. In this case, the electrode wiring layer 13 completely fills the grooves 15, and its surface perfectly coincides with the surface of the insulating layer.

The semiconductor device of this embodiment is fablicated basically in the sane process as that of the prior art device up to the formation of the insulating layer 12 on the semiconductor substrate 11 made of silicon. The thickness of the insulating layer 12 according to the invention is conveniently 1.5 to $2\mu$ while it is about 0.5 to $1\mu$ in the prior art. Then, the resist 14 which is in an inverse relation to a desired wiring pattern (i.e., relation between positive and negative) is formed on the insulating layer 12 (FIG. 1(b)). The insulating layer 12 is then etched with the resist as a mask (FIG. 1(c)). The etching depth in this step is determined such that it is approximately equal to or greater than the thickness of electrode wiring layer. Then, the resist 14 is removed using plasma or by immersion in an oxide solution (FIG. 1(d)). Thus, planar grooves 15 corresponding to the electrode wiring pattern are formed in the insulating layer 12. Then, the wiring material layer 13A is formed on the entire surface by means of CVD (chemical vapor deposition) or spattering. At this point, the film is also formed on the inner wall surfaces of the grooves 15. Therefore, when the film thickness is increased to a certain extent, the grooves are completely filled (FIG. 1(e)). It has been known that in order to reliably fill the grooves it is effective to apply a low bias voltage to the substrate while forming the film 13A.

Figure 1F:
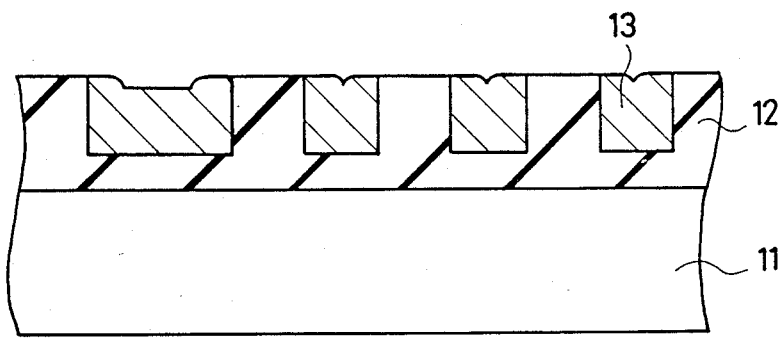

Subsequently, the wiring material layer 13A is etched by RIE (reactive ion etching) to reduce the film thickness until the the wiring material layer 13 is left only in the grooves 15 forming electrodes 13 FIG. 1(f)). Thereafter, the annealing for making an ohmic contact may be performed as in the prior art.

Figure 2A:
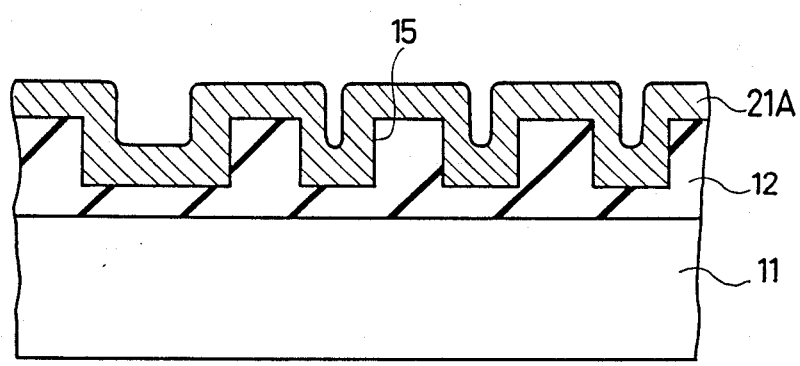
FIGS. 2(a) to 2(c) are sectional views showing steps of of making a semiconductor device according to another embodiment of the invention.
Figure 2B:
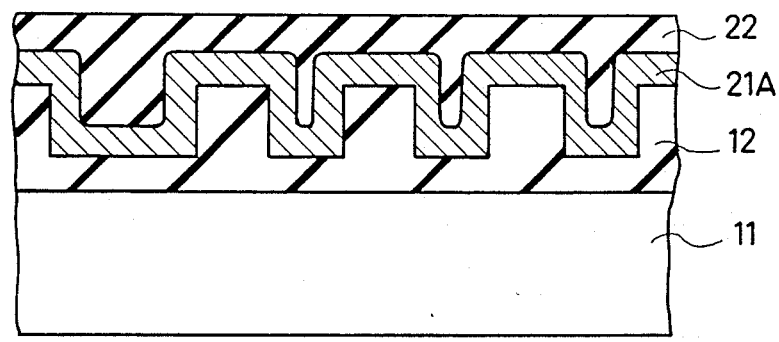
Figure 2C:
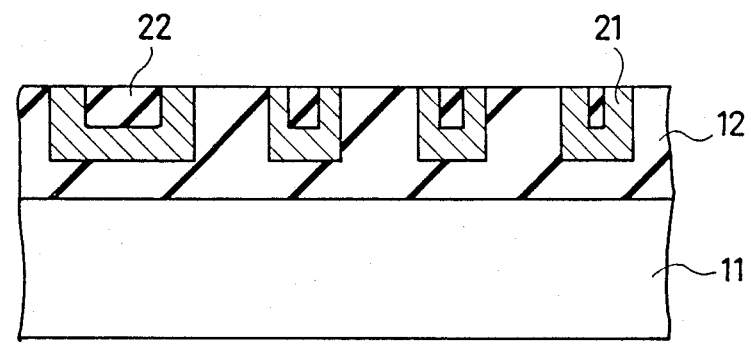
Figure 3A:
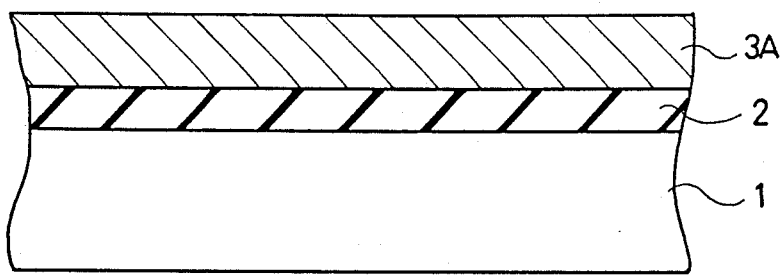
FIGS. 3(a) to 3(d) are sectional views showing steps of a prior art method.
Figure 3B:
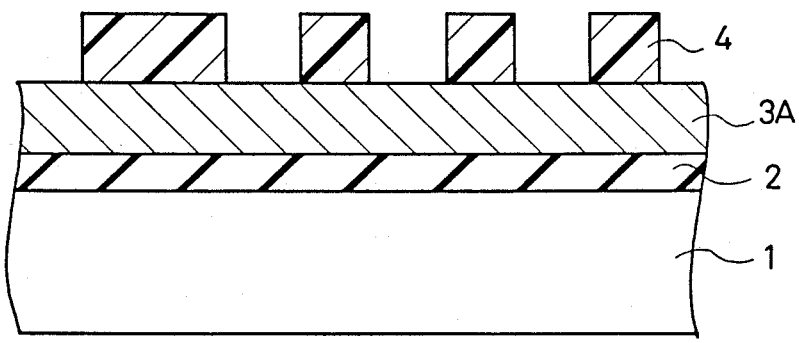
Figure 3C:
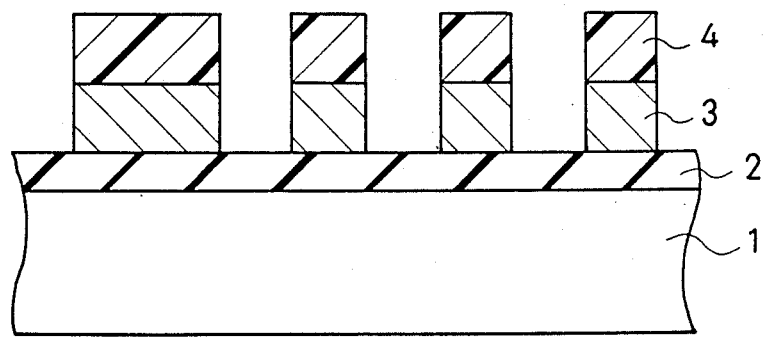
Figure 3D:
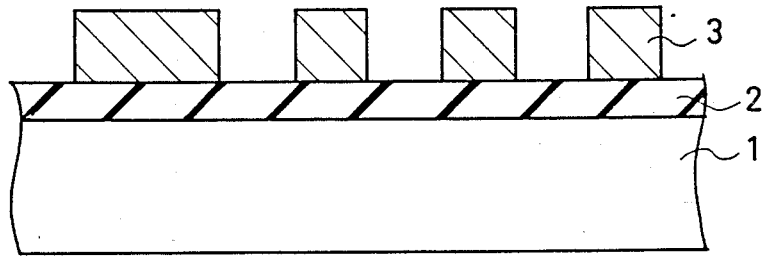

In the above embodiment, the surface of the device is flattened with the formation of the electrode wiring layer 13. However, it is possible to form a wiring material layer 21A that is too thin form a flat surface such as shown in (FIG. 2 (a)), and the surface is flattened by forming a second insulating layer 22 by coating or CVD on the wiring material layer 21A and then etching the entire surface. In this case, it is possible to flatten the surface by etching the wiring material layer 21A and insulating layer 22 substantially at an equal etching speed (FIG. 2(c)). Reference numeral 21 designates an electrode wiring layer. The electrode wiring layer 21 is formed to a constant thickness on the inner surfaces of the grooves 15. The insulating layer 22 is formed to fill recesses formed on the surface of the electrode wiring layer 21.

In the above embodiment, an aluminum alloy has been used for the electrode wiring layer. However, the same results may be obtained by using tungsten, molybdenum or other high-melting metals or silicides thereof. In the above embodiment a single electrode wiring layer is formed. Where two or more electrode wiring layers are formed, fine electrode wiring patterns may of course be formed by repeating entirely the same process.

As has been described in the foregoing, according to the invention an electrode wiring layer is burried in grooves that have been formed in advance. Therefore, it is possible to increase the integration density of the electrode wiring. Nevertheless, it is possible to obtain a semiconductor device, which is flat at the top and has high reliability. Further, it has no a high light reflectivity layer such as an aluminum alloy layer but a ground insulating layer having a low light reflectivity that has a pattern of the electrode wiring the electrode wiring.

What is claimed is:

1. A semiconductor device comprising:
   a semiconductor substrate;
   a first insulating layer formed on said semiconductor substrate;
   a plurality of grooves formed on said first insulating layer into a depth which is less than a thickness of said first insulating layer;
   an electrode wiring layer formed in said grooves so as to have a generally C-shaped cross section; and
   a second insulating layer formed in an opening of said electrode wiring layer.

2. The semiconductor device of claim 1, wherein said electrode wiring and second insulating layers have their surfaces substantially flush with a surface of said first insulating layer.

* * * * *